United States Patent
Chan et al.

(10) Patent No.: US 6,480,982 B1
(45) Date of Patent: Nov. 12, 2002

(54) COMPUTER RAM MEMORY SYSTEM WITH ENHANCED SCRUBBING AND SPARING

(75) Inventors: Kenneth Y. Chan, Hopewell Junction, NY (US); Charles D. Holtz, Catskill, NY (US); Kevin W. Kark, Poughkeepsie, NY (US); Russell W. Lavallee, Lagrangeville, NY (US); William W. Shen, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/325,814

(22) Filed: Jun. 4, 1999

(51) Int. Cl.[7] ................................................ G11C 29/00
(52) U.S. Cl. ..................................................... 714/764
(58) Field of Search ............................... 714/7, 25, 764

(56) References Cited

U.S. PATENT DOCUMENTS

| | | | |
|---|---|---|---|
| 4,964,130 A | * 10/1990 | Bowden, III et al. | ....... 714/764 |
| 5,267,242 A | 11/1993 | Lavellee et al. | ............... 714/7 |
| 5,479,640 A | 12/1995 | Cartman et al. | ............ 711/111 |
| 5,495,491 A | * 2/1996 | Snowden et al. | ........... 714/764 |
| 5,659,678 A | * 8/1997 | Aichelmann, Jr. et al. | .... 714/25 |
| 5,996,096 A | * 11/1999 | Dell et al. | ................... 714/710 |
| 6,065,134 A | * 5/2000 | Bair et al. | ...................... 714/7 |

OTHER PUBLICATIONS

Muller et al., RAS strategy for IBM s/390 Gs and G6, IBM Journal Research and Development, p. 1–16, 1999.*
Doettling et al., s/390 Parallel enterprise server generation 3: a blanaced system and cache structure, IBM Journal Research and Development, p. 1–27, 1997.*
Yang, Reliability of Semiconductor RAMs with Soft–Error Scrubbing Techniques, IEEE, p. 337–344, Sep. 1995.*
Goodman et al. The reliability of Semiconductor RAM Memories with on–Chip Error Correction Coding, IEEE, p. 884–896, May 1991.*

* cited by examiner

Primary Examiner—Albert Decady
Assistant Examiner—Shelly A Chase
(74) Attorney, Agent, or Firm—Lynn Augspurger; Cantor Colburn LLP

(57) ABSTRACT

In a computer RAM memory system, the memory is subjected to a self test operation during which data is written to and read out from each address location of the memory. The data read out is compared with the written data to detect errors and the number of errors at each bit position is counted. When the number of errors in a bit position exceeds a selected threshold, the corresponding DRAM is replaced by a spare DRAM. When the self test detects two or more errors in the same double word, the DRAM corresponding to the bit position having the highest error count is replaced with a spare DRAM. The memory is periodically scrubbed and errors detected during the scrubbing operation are counted for each bit position. At the end of the scrubbing of a chip row the DRAMs corresponding to bit positions at which the error counts exceed a selected threshold are replaced with spare DRAMs. When a multiple bit error in a double word is detected during scrubbing, the corresponding double word is tagged.

13 Claims, 4 Drawing Sheets

COMPUTER RAM MEMORY SYSTEM WITH ENHANCED SCRUBBING AND SPARING

FIELD OF THE INVENTION

This invention relates to computer RAM memory systems and, more particularly, to improved sparing and scrubbing operations in a computer RAM memory system.

TRADEMARKS

S/390 and IBM are registered trademarks of International Business Machines Corporation, Armonk, N.Y., U.S.A. and Lutus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUNDS

In a computer RAM memory system, data is stored in DRAMs mounted on memory cards. The DRAMs store data in the form of electrical charges in semiconductor arrays. In one typical system, data is stored on the DRAMs of the memory cards in the form of double words, each comprising 64 data bits and 8 error checking bits making a total of 72 bits per double word. The error checking bits (ECC bits), function to indicate when an error exists in the 64 data bits and indicate if the error is a single bit error or a multiple bit error. A single bit error describes the condition when just one of 64 data bits of a double word is in error. A multiple bit error describes the condition when two or more data bits in a double word is in error. A double bit error describes the condition when two bits in a double word are in error. If the ECC bits indicate that the error is a single bit error, the ECC bits will also indicate which data bit is in error and thus enable it to be corrected.

Scrubbing is an operation in which the ECC bits are used to detect and correct single bit errors. Sparing is an operation in which a DRAM on a memory card, determined to be defective, is logically replaced with a spare DRAM mounted on the memory card for that purpose. In U.S. Pat. No. 5,267,242, invented by Lavallee et al., issued Nov. 30, 1993, a scrubbing and sparing operation for a RAM memory system is disclosed. In this system, a hardware unit, called a hardware memory tester (HAMT), is used to perform the sparing and scrubbing operation.

In the system of the patent, a single spare DRAM is provided on each memory card and sparing is carried out in response to testing the DRAMs on the memory card by reading out data, restoring the data and then comparing the restored data with the original data read out from the memory. Counters are provided for each bit position in data being read out from the memory card in parallel and when an error is detected, the corresponding counter is incremented. If the count in a counter reaches a predetermined threshold, this indicates that the DRAM corresponding to the counter is defective and the defective DRAM is logically replaced with the spare DRAM mounted on the memory card. Scrubbing is carried out by using the ECC bits in each double word to correct single bit errors. If multiple bit errors are detected, they are ignored.

SUMMARY OF THE INVENTION

In the system of the present invention, each memory card is provided with a plurality of spare DRAMs. In the specific embodiment of the invention, four DRAMs are provided for each memory card. During initial machine loading of the memory card, the memory is subjected to a self-test operation during which data is written to and read out from each memory location. The data read out from the memory location is compared with the corresponding data written to the corresponding memory location. When the comparison indicates an error, a counter corresponding to the bit position in which the bit occurred is incremented. When the count in a counter exceeds a threshold level for a given chip row, the DRAM corresponding to such counter is considered to be a defective DRAM and is logically replaced by a spare DRAM. The logical replacement of a DRAM is called sparing the replaced DRAM. When the self-test detects two errors in the same double word, the DRAM corresponding to the counter with the highest count in the chip row is spared whether or not the count in such counter has exceeded the threshold level. Because there is a strong probability that the DRAM corresponding to the counter registering the highest count will correspond to one of the bits in the multiple bit error, the sparing of the DRAM corresponding to the counter having the highest count will be likely to convert a double bit error into a correctable single bit error.

Scrubbing is carried out periodically at fixed intervals of time and is executed in the background of the normal system of operation. During scrubbing, whenever the ECC bits of a double word indicate a single bit error has occurred, the error is corrected and the counter corresponding to the bit position of the error is incremented. At the end of the scrubbing of a chip row, the counters are examined and if any of the counters exceed the threshold, the corresponding DRAM is spared. The scrubbing operation of the chip row is then repeated in a mode of operation called half spare mode. If, during the first scrubbing cycle a multiple bit error is detected, the data in the double word containing the multiple bit error is left unchanged. The sparing carried out at the end of the first scrubbing cycle through the chip row may convert a double bit error to a single bit correctable error. If during the scrubbing cycle in the half spare mode through the chip row, a multiple bit error is detected, a special uncorrectable error pattern ("SPUE tag") is appended to the double bit word containing the multiple bit error to prevent data from being stored or read out from the address position of the double word containing the bit error. In addition, the second scrubbing cycle through the chip row will move corrected data from the defective DRAMs to the spare DRAMS replacing the defective DRAMS in the sparing operation. Following the half spare mode, the chip row is then scrubbed again in what is called the full spare mode, and again any single bit errors detected are corrected. In the full spare mode, any multiple bit errors are ignored.

In the system as described above, single bit errors are corrected by scrubbing, double bit errors are converted to single bit errors and the storage locations corresponding to double bit errors which cannot be corrected are effectively removed from the system and prevented from being accessed in conventional store and fetch operations.

DESCRIPTION OF THE DRAWINGS

The foregoing and other objects, aspects and advantages will be better understood from the following detailed description of a preferred embodiment of the invention with reference to the drawings, wherein.

DETAILED DESCRIPTION OF THE INVENTION

Figure 1:
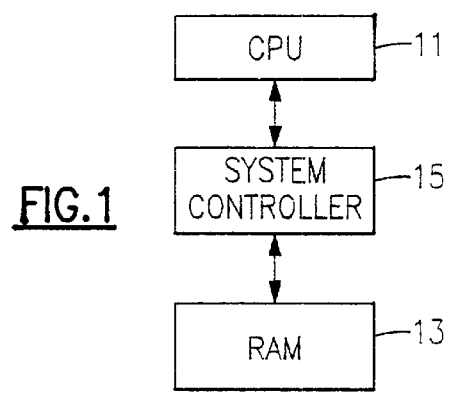
FIG. 1 is a block diagram illustrating a system in which the present invention is employed.
Figure 2:
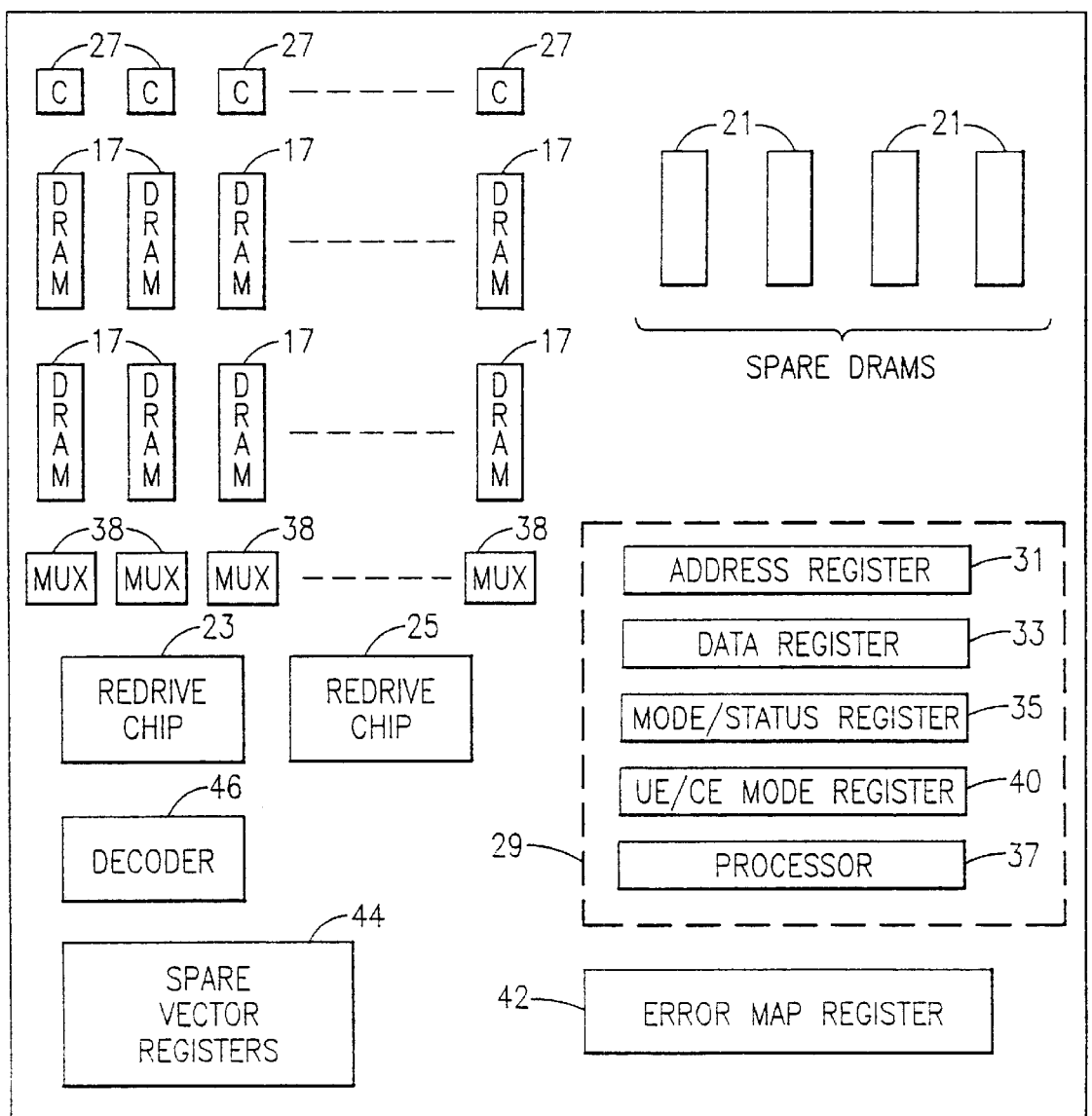
FIG. 2 is a block diagram illustrating a PMA card in which the present invention is employed.

The present invention is employed in the IBM S/390 CMOS G5 machine, a portion of which is schematically illustrated in the block diagram of FIG. 1. As shown in FIG. 1, the central processing unit 11 controls access to a semiconductor random access memory 13 through a system controller 15. The random access memory 13 is made up of memory cards 14 called PMA cards, each of which comprise a multiplicity of semiconductor memory chips called DRAMs, which are arranged in chip rows. Each chip row may for example contain 144 DRAMs 17 as shown in FIG. 2. Each DRAM chip stores bits in a 4×1 megabit array. Data read out from a chip is presented on four parallel output channels. In the specific embodiment of the invention, the four output channels are multiplexed to two channels per chip so that 288 bits are presented by the 144 DRAMs of the chip row in parallel.

The data being read out on the 288 parallel channels is organized into four double words (or two quadwords). Each double word comprises 72 bits made up of 64 data bits and 8 ECC bits. The individual bits of a double word each come from a different DRAM. Thus, each double word will be distributed across 72 DRAMs with two double words coming from one half of the PMA card and the two double words coming from the other half of the PMA card. In addition to DRAMs 17, each PMA card will have four DRAMs 21 provided for purposes of an operation called sparing. Sparing is the operation in which one or more of the DRAMs 17 found to be defective is logically replaced by one or more of the spare DRAMs 21. A sparing operation is described in U.S. Pat. No. 5,267,242 issued Nov. 30, 1993 to Russell W. Lavelee et al. and assigned to International Business Machines Corporation. The addressing storage locations in the DRAMs 17 are controlled by redrive chips 23 and 25 under the control of commands received from the central processing unit 11 through the system controller 15. Each double word stored in the DRAMs is separately addressable by the system controller via the redrive chips 23 and 25.

A set of 288 error checking counters 27 are provided on the memory card, one counter corresponding to each bit read out in parallel from a chip row on the PMA card. The counters 27 are 25 used in the sparing operation to determine when one or more of the DRAMs 17 should be replaced by a spare DRAM 21.

In accordance with the present invention, during the initial machine loading operation, a self-test operation is carried out on each PMA card. The self-test operation is carried out by hardware 29 in response to commands received from the CPU via the system controller. The self-test hardware 29 includes a self-test address register 31, a data register 33, a mode/status register 35, a CE/UE mode register 40 and a processor 37. The self-test operation is carried out on a chip row basis. During the self-test of a chip row, data will be stored in all of the bit locations of the DRAMs 17 of the chip row in a predetermined pattern or in a random pattern. The stored data is then read out and compared bit by bit with the data that was stored to detect errors, which are counted by the counters 27.

To set up the memory card to run the self-test function, the following steps are required to be performed by the CPU 11 via the system controller 15. First, the self-test address register 31 is set up with addresses to identify the chip row to be tested, the START address, which identifies the first line address of the chip row, and the STOP address, which identifies the last line address of the chip row. A line address identifies a storage location storing a line, which consists of 16 double words. If the data to be stored in the chip row is a predetermined data pattern, then this data pattern is stored in the self-test data registers 33 in 16 quadwords (two lines). The data pattern represented by the 16 quadwords will be stored in the first 16 quadword storage locations in the chip row and repeated throughout the chip row to fill the chip row with the data pattern. If the data stored in the chip row is random data, then the first address in the chip row is stored with QW0 as seed data and then the remaining data is generated randomly from the seed data. The random data is also stored in the data register 33 as it is stored in the DRAMs 17. The self-test mode/status register 35 is set up to select DRAM testing and to select a store-fetch mode of operation. The self-test mode/status register 35 is also set to enable the counters 27 to be read at the end of the self-test of each chip row. The counters are examined at the end of testing of each chip row in the self-test operation to determine which DRAMs in the chip row are to be replaced in the sparing operation as described in more detail below.

To start the self-test operation, the progress bit in the mode/status register is set to ON. The processor 37 examines the progress bit and when the progress bit is on, the processor 37 carries out the self-test function as a sequence of steps. If the self-test is by a predetermined pattern, the processor reads the data pattern out of the self-test data registers and stores the data pattern in the chip row being tested and then fetches the stored data from the chip row. The processor 37 compares the fetched data with the data in the data registers to detect errors. The self-test process starts the storing and fetching operation at the start address in the self-test address register and proceeds through the entire chip row until the stop address stored in the address register is reached. After completing the fetch-store operation at the stop address, the processor 37 sets the progress bit in the mode/status register 35 to OFF and sets a test complete bit to ON. During the testing, each time an error is detected, the counter 17 corresponding to the bit position in which the error is detected is incremented. In addition, when an error is detected, a failed bit in the CE/UE mode register 40 is set to indicate that an error has been detected. When the self-test detects a single bit in a double word to be in error, the detected error will correspond to a correctable error and the CE failed bit is set in the mode/status register 40. If two or more bits in the same double word are detected, such an error will correspond to an uncorrectable error. Accordingly, when the self-test detector detects two or more error bits in the same double word, a UE failed bit in the mode register 40 is set.

Following the self-test operation, a sparing operation is carried out to logically replace defective DRAMs with spare DRAMs. The counters 17 are examined to determine which DRAMs to replace.

The actual hardware to carry out this sparing operation is described in the above-mentioned Pat. No. 5,267,242. As described in this patent, each output bit position from the DRAMs 17 is connected to a multiplexer 38, which also receives outputs from the spare DRAMs. When a DRAM is determined to be defective, data identifying the defective DRAM is inserted into one of four vector registers 44, one corresponding to each spare DRAM 21. A decoder 46 responding to this data switches the multiplexers 38 receiving the outputs from the defective DRAM to transmit bits received from the selected spare DRAM.

Figure 3A:
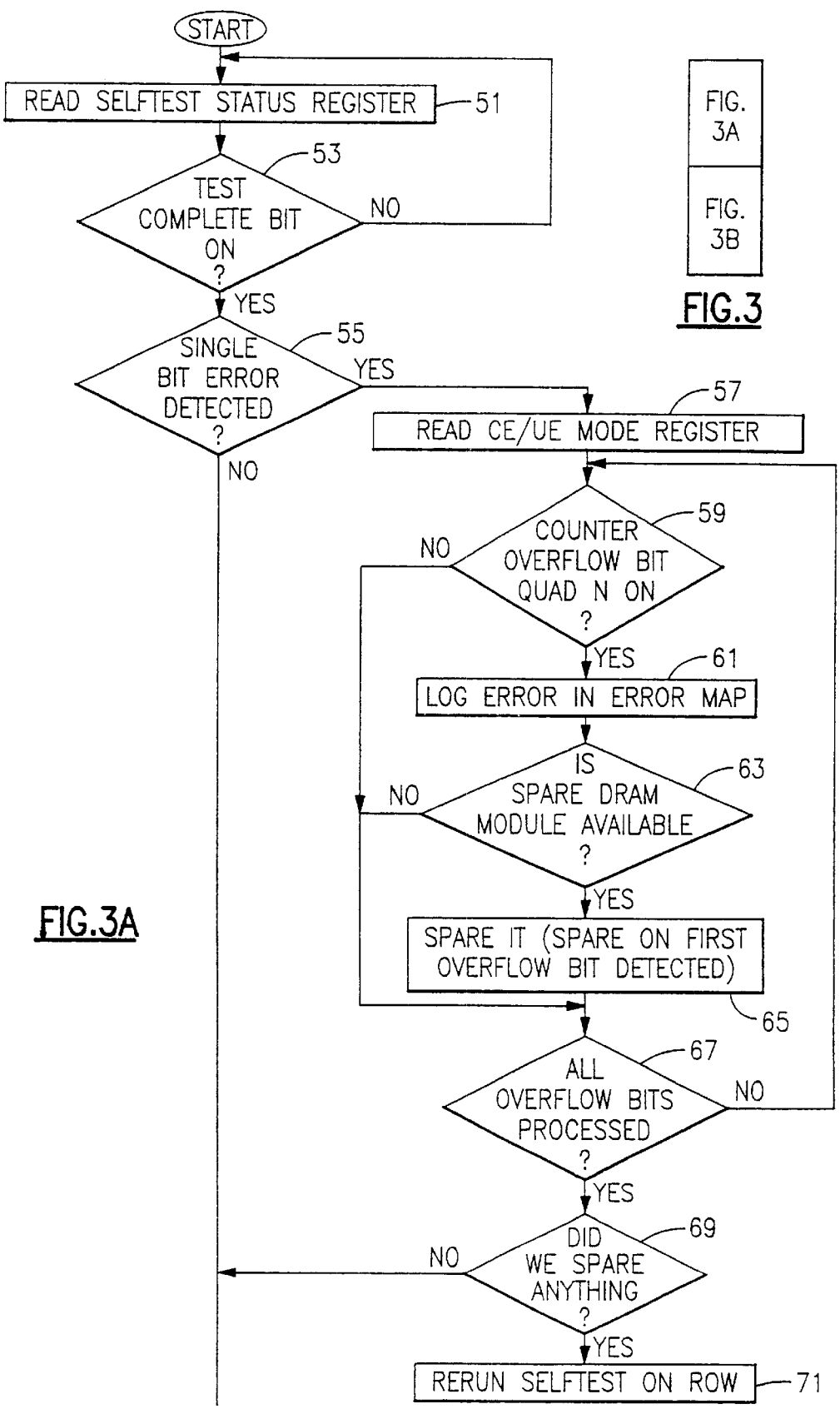
FIG. 3 is a flow chart illustrating the sparing process carried out following its self-test operation on the DRAMs on the memory cards.
Figure 3B:
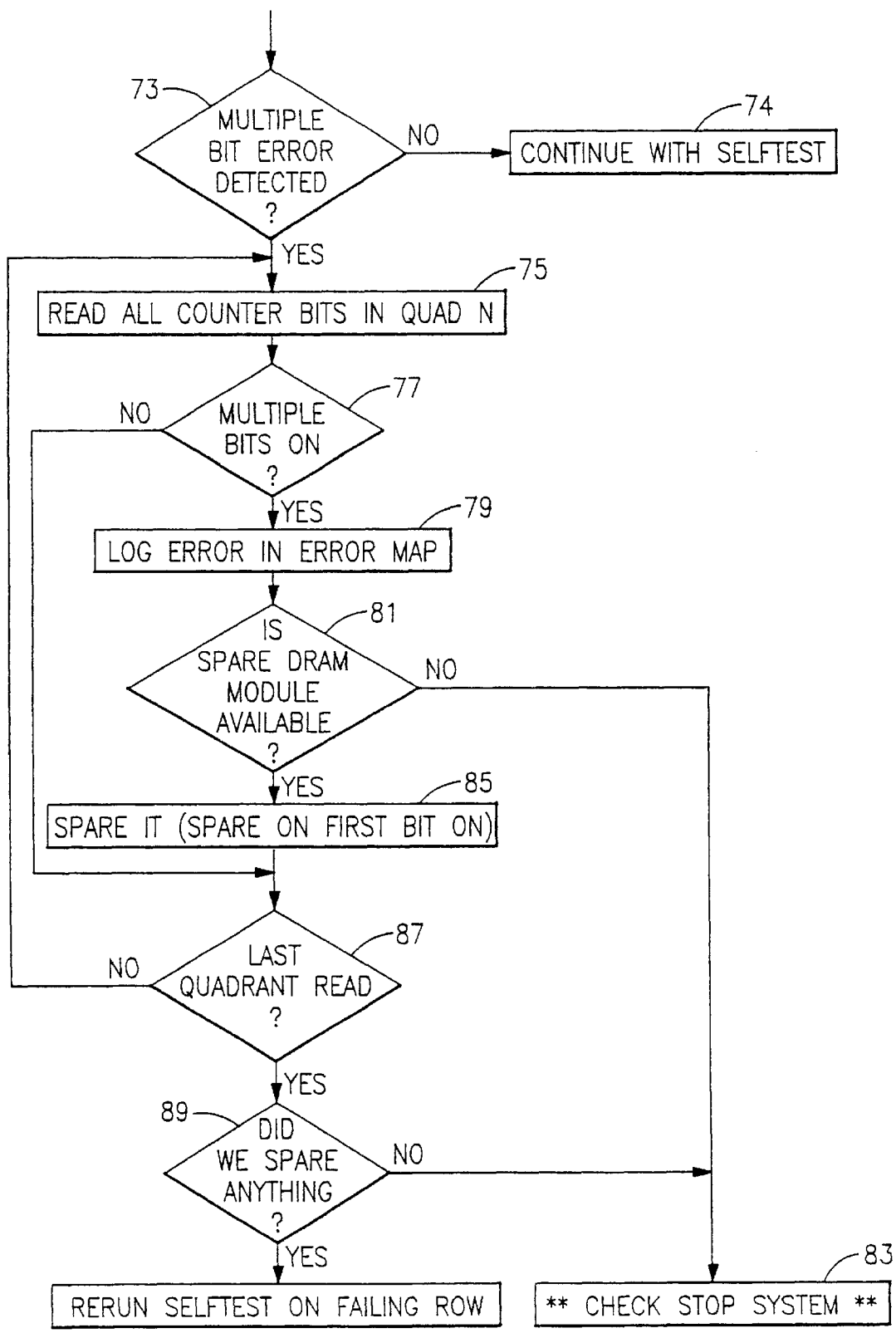
Figure 4:
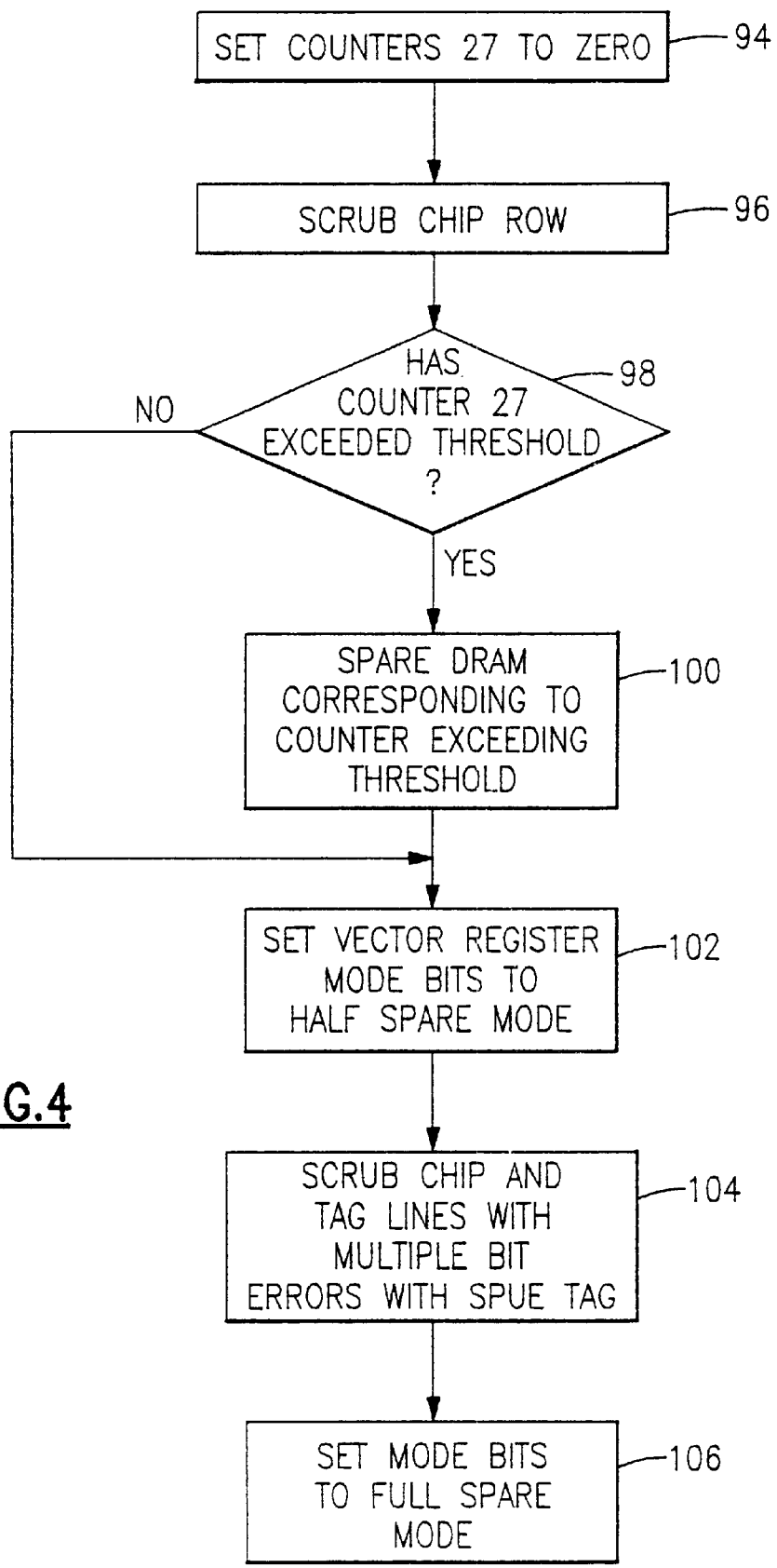
FIG. 4 is a flow chart illustrating the scrubbing and sparing operation employed in the present invention executed in the background of normal system operations.

The flow chart shown in FIG. 3 illustrates the sparing operation process in which defective DRAMs are identified and replaced with a spare DRAM in connection with the self-test process on a chip row. As shown in FIG. 3, the process first reads the self-test mode/status register 35 in step 51 and then in step 53 determines whether or not the task complete bit in the mode/status register in ON. If the test complete bit is not ON, it means that the self-test process has not been completed on the chip row being tested and the process returns to step 51 to again read out the self-test mode status register. When in step 53, the program determines that the test complete bit is on, the process proceeds into step 55 wherein the CE failed bit in the mode register 40 is examined. If the CE failed bit indicates that a single bit error occurred, the process branches to step 57, in which overflow bits in the mode register 40 are read out. The mode register 40 contains overflow bits from the counters 27. When one of the counters 27 reaches a predetermined threshold, an overflow bit in the mode register 40 corresponding to the counter is set indicating that the DRAM corresponding to this counter is defective and should be spared if possible. Following step 57, the process proceeds into step 59 in which it is determined whether or not any of the overflow bits in the mode/status register 40 have been set. If so, in step 61, an error is logged in the error map register 42 to indicate the DRAM which is thus determined to be defective. Following step 61, the process determines in step 63 whether or not a spare DRAM is available. If a spare DRAM is available, the program proceeds into step 65 wherein the DRAM 17 corresponding to the first overflow bit detected in the mode register 40 is spared whereupon the process proceeds into step 67. To spare the defective DRAM, the identification of the defective DRAM, including its chip row number and location within the chip row, is stored in one of four spare vector registers 44, corresponding to the spare DRAM 21 selected to replace the defective DRAM. The identification of the defective DRAM is obtained from the error map register 42. If in step 59, no counter overflow bits are set in the mode register 40, the program proceeds directly from this step 59 into step 67. Similarly, if it is determined in step 63 that no spare DRAM is available, the program proceeds into step 67. It is contemplated that all of the four spare DRAMs 21 may be used in previous sparing operations and, accordingly, there will be no spare DRAM available when step 63 is reached in the process. In step 67, the process determines whether or not all of the counter overflow bits in the mode register 40 have been processed. If not, the program returns to step 59 and the program recycles through steps 59 through 65. If all of the overflow bits have been processed, the process proceeds into step 69. If any sparing is carried out in the previous cycling through steps 59 through 65, the process proceeds from step 69 into step 71 which turns the progress bit in the mode register back to ON to cause the self-test procedure on the chip row to be repeated. If no sparing occurred during the cycling through steps 59 through 65, the program branches into step 73.

If, in step 55, it is determined that the CE failed bit is not set indicating that no error corresponding to a single bit error was detected during the self-test process, the program proceeds directly from step 55 into step 73. In step 73, the process examines the UE failed bit in the register 40 and if the UE bit is not set, indicating that there was no error corresponding to multiple bit error detected during the self-test processor on the chip row, the program branches to step 74 to continue the self-test on the next chip row. If in step 73 it is determined, from the UE failed bit being set, that an error corresponding to a multiple bit error occurred, then the contents of all of the counters 27 are read in step 75. Then in step 77 it is determined whether any of the counters 27 register multiple bit counts. If so, in step 79, the process determines which counter has the highest count. It is presumed that the DRAM corresponding to the counter 27 with the highest count is likely to be the cause of one of the errors of the multiple bit error. Accordingly, identification of this DRAM is logged in the error map register 42 in step 79. Then in step 81, it is determined whether or not a spare DRAM 21 is available. If no spare DRAM is available in step 81, the process branches to step 83 wherein the sparing process is stopped. If a spare DRAM is available, the process proceeds into step 85 wherein the DRAM identified in the error map register 42 as being defective is spared in the same manner as described for step 65. The process then proceeds into step 87 wherein it is determined whether or not the last quadrant of the chip row has been subjected to the UE error sparing process. If the last quadrant has not been subjected to UE sparing process, whereupon the process returns to step 75 to recycle through steps 75 through 85 until the last quadrant is subjected to sparing whereupon the process proceeds into the step 89. In step 89, it is determined whether or not any DRAMs were spared during the preceding cycles through steps 75–85. If one of the DRAMs was spared, then the process proceeds into step 90 wherein the self-test on the chip row is repeated. If there was no sparing during the previous cycles or cycle through steps 75–85, the program branches to step 83 to terminate the sparing process. If in step 77 it is determined that none of the counters 27 register multiple bit counts, no sparing for uncorrectable errors is needed for that quadrant and the process branches from step 77 to step 87.

In the above described process, when a multiple bit error occurs and is detected, one of the defective DRAMs causing the multiple bit error should be spared. As a result, uncorrectable errors caused by two defective DRAMs corresponding to the same double word can be converted into a single bit correctable errors. As a result, the occurrence of uncorrectable multiple bit errors is minimized.

After initial machine loading, during normal operation of the memory system, the memory is periodically scrubbed under the control of the central processing unit by means of the central processing unit millicode. The central processing unit issues a line address to the system controller identifying the memory section to be scrubbed. The system controller then issues a command to the PMA card for a special fetch/store operation to carry out the scrubbing. The scrubbing, as described below, is done at fixed intervals of time and is executed as background of normal system operations. The scrubbing is done on a card basis. First, all of the addresses of PMA 0 will be scrubbed and then all the addresses of PMA 1 will be scrubbed, if available, and the process will continue until all of the PMA cards have been scrubbed. In addition, within an individual PMA card, the scrubbing is done on a chip row basis. At the beginning of the scrubbing of each chip row on a given PMA card, the mode bits in the vector registers will be set to call for a full spare mode. In the first step 94 of the normal scrubbing process, the counters 27 are reset to zero. Next, in step 96, the chip row is scrubbed. To carry out the scrubbing operation, the system controller issues the command TEST LINE 128B to the PMA card. In response to this command, the quadwords in the address identified by the line address specified in the command are fetched by the redrive chips 23 and 25. The quadwords are received by the system controller which then responds to the error checking code in each double word to determine the occurrence of single bit or double bit errors. If a single bit error (correctable error) is detected, the error checking code indicates the bit position of this error. The system controller then corrects the error and issues the command SCRUB STORE 128B to the PMA card. The scrub store command will cause the double word to be stored back in the double word address location in the DRAMs with the bit detected to be in error corrected. This process is repeated for each double word storage location throughout the chip row. Each time a single bit error is detected, the counter 27 corresponding to the detected error is incremented by the system controller. When the end of the chip row is reached, the counters 27 are examined by the system controller in step 98 to determine whether the count in any of the counters 27 have reached the predetermined threshold value. If any of the counters have reached the threshold level indicating a defective DRAM, a sparing operation is needed. The defective DRAM is then spared in step 100. In this step, the identification of the defective DRAM is stored in the selected spare vector register by the system controller. Accordingly, in subsequent fetch or store operations, the defective DRAM will be logically replaced. Then the mode bits in the vector register are set to the half spare mode in step 102 by the system controller. Following the setting of the vector register to the half spare mode, the same chip row is then subjected to another scrubbing operation in step 104 wherein the data from each address in the chip row are fetched and restored with any single bit error corrected. If during this scrubbing operation in the half spare mode, the error checking code indicates that a multiple bit error exists in a double word, a different process is followed. When a multiple bit error is detected during the first scrubbing cycle through the chip row in the full spare mode, no scrub store command is issued to the memory card and the data is left in the double word uncorrected. During the half spare mode scrubbing, each double word is fetched from the DRAM and any single bit errors in the double word fetched are corrected in accordance with the ECC bits of the double word. In the scrub store operation, the data is stored back in the chip row, but with any defective DRAMs replaced with spare DRAMs so that the data bits from the defective DRAM are effectively moved into the spare DRAM.

In addition, the sparing operation in the full spare mode scrubbing cycle may correct some double bit errors into single bit errors which will be corrected by the scrubbing of the chip row in the half spare mode. If a multiple bit error is detected during the half spare mode, the SPUE tag for the line (16 quadwords) in which the double word is located is forced to OFF so that the memory card will ignore any data sent from the SCE to be stored in the line tagged with the SPUE tag and will return the SPUE data pattern in response to any fetch command to retrieve data from this storage location.

At the end of the scrubbing of the chip row during the half spare mode of operation, the mode bits in the vector registers are set to the full spare mode in step 106. The counters 17 are not examined at the end of the half spare mode since they may contain error counts from the defective DRAMs which have been spared. Instead, the counters are reset to zero for the scrubbing operation to be carried out on the next chip row or the next PMA card.

The mode bits in the vector registers, in addition to calling for a full spare mode or half spare mode, can also be set to call for a no spare or null mode of scrubbing. When the mode bits in the vector registers are set to the null or no spare mode, the corresponding spare DRAM is accessed and compared with the data stored in the DRAM identified in corresponding the spare vector register. If an error in the data in the spare DRAM is detected, a spare DRAM error bit in an error register is turned on. When this error bit in the error bit register has been turned on, it prevents the corresponding spare DRAM from being used as a replacement DRAM.

With the system as described above, potential double bit errors are corrected to single bit errors, both in connection with the self-test operation and in connection with the scrubbing operation. As a result, the incidence of uncorrectable errors is substantially reduced. In addition, storage locations having double bit errors after the sparing operation are in effect eliminated from the system.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of reducing errors in a random access memory, said random access memory comprising an array of DRAMs arranged in at least one chip row, wherein said method is at least partially carried out by executing central processor unit millicode instructions, further wherein data is fetched from said DRAMS in said chip row in parallel and each said DRAM in said chip row corresponds to a different bit position in said fetched data, comprising:

scrubbing each storage location in said random access memory during a first mode of operation, said scrubbing being performed on a chip row basis, wherein said first mode includes counting for each bit position the single bit errors corrected by said first mode scrubbing operation, ignoring multiple bit errors detected during said first mode scrubbing operation, sparing a DRAM corresponding to a bit position for which the error count exceeds a predetermined threshold at the end of said first mode of operation; and scrubbing the storage locations in said random access memory during a second mode of operation in response to said error counter exceeding said predetermined threshold during said first mode of operation, and storing a SPUE tag to storage locations detected as containing multiple bit errors during said second mode scrubbing.

2. A method for correcting and detecting errors in a computer memory system, wherein said computer memory system comprises at least one row of memory chips, further wherein data is fetched from said computer memory chips in parallel and each memory chip in said chip row corresponds to a different bit position in said fetched data, comprising:

initializing at least one error counter, each error counter corresponding to a memory chip, said error counter being incremented where a single-bit error is detected in said corresponding memory chip;

scrubbing said chip row, said scrubbing including correcting single bit errors;

modifying the value of a register in response to said error counter exceeding a threshold, said modification indicating a change to half spare mode, said half spare mode comprising:

reinitializing said error counter,
performing a second scrubbing of said chip row,
storing a SPUE pattern to a storage location of said chip row wherein
said storage location is detected as containing a multi-bit error,
sparing a chip in said chip row wherein said error counter corresponding to said chip exceeds a threshold;
modifying the value of said register, said modification indicating a change to full spare mode, said full spare mode comprising:
reinitializing said error counter,
scrubbing said chip row; and
modifying the value of said register in response to said error counter exceeding a threshold, said modification indicating a change to half spare mode.

3. A method as in claim 2 wherein computer program code for incrementing and evaluating said counter, for alternating between said first and second modes of operation, and for storing said SPUE patterns is central processor unit millicode, said millicode being executed by a processor.

4. A method as in claim 2 wherein said detecting and correcting of error further comprises detecting and correcting errors located in said computer memory system during the initial loading operation of a machine, said computer memory being located in said machine.

5. A method of detecting and correcting errors in a computer memory system, comprising:
scrubbing a chip row of said computer memory, said scrubbing including detecting single-bit and multi-bit errors, said scrubbing also including correcting single-bit errors;
incrementing the value of a counter in response to the detection of an error during said scrubbing;
modifying the value of a register in response to said counter value exceeding a threshold, said modification indicating a change to half spare mode, said half spare mode causing a request to write first data to a defective location in said chip row to result in the writing of said data to both said defective location and to a spare memory location, further wherein a request to fetch a second data from a defective location in said chip row causes the fetching of said second data from said defective location;
scrubbing said chip row in response to said indication of half spare mode, said scrubbing including detecting single-bit and multi-bit errors and correcting single bit errors, wherein the detection of a multi-bit error causes a SPUE pattern to stored to the memory location containing the uncorrectable error;
sparing a chip in said chip row where a counter value corresponding to said chip exceeds a threshold;
modifying the value of said register in response to the completion of said half mode, said modification indicating a change to full spare mode, said full spare mode causing a request to write a third data to said defective location in said computer memory to result in the writing of said third data to said spare memory location, further wherein a request to fetch a fourth data from a defective location in said computer memory causes the fetching of said fourth data from said spare memory location;
scrubbing said chip row in response to said indication of full spare mode, said scrubbing including detecting single-bit and multi-bit errors and correcting single bit errors; and
modifying the value of a register in response to said counter value exceeding a threshold, said modification indicating a change to half spare mode.

6. A method as in claim 5 wherein computer program code for incrementing and evaluating said counter, for alternating between said first and second modes of operation, and for storing said SPUE patterns is central processor unit millicode, said millicode being executed by a processor.

7. A method as in claim 5 wherein said detecting and correcting of error further comprises detecting and correcting errors located in said computer memory system during the initial loading operation of a machine, said computer memory being located in said machine.

8. A method as in claim 5 wherein said error detection and correction during the initial loading operation of a machine further comprises scrubbing said computer memory.

9. A method of detecting and correcting errors in a computer memory system, comprising:
initiating a first mode of operation in response to the identification of a first portion of a first computer memory and/or a first portion of a second computer memory as being defective, said first mode of operation further comprising:
scrubbing at least one of the following:
said first portion of first computer memory, said first portion of first computer memory not having previously been spared, or
said first portion of second computer memory, said first portion of second computer memory having previously been substituted for spared first and/or second computer memory, and
sparing said first portion of first computer memory and/or said first portion of second computer memory with a second portion of second computer memory, said spared first portions of first and/or second computer memory having been identified as being defective during said first mode scrubbing,
wherein the detection of an unrecoverable error in said first portions of first and/or second memory during said first mode scrubbing causes the storing of a SPUE pattern in said first portions of first and/or second computer memory containing said unrecoverable error, further wherein a request to write a first data to said defective portions of first and/or second computer memory causes the writing of said first data to said defective portions of first and/or second computer memory and to said second portion of second computer memory, further wherein a request to fetch a second data from said defective portions of first and/or second computer memory causes the fetching of said second data from said defective portions of first and/or second computer memory; and
initiating a second mode of operation in response to the completion of said first mode of operation, said second mode of operation further comprising:
scrubbing said first portions of first and/or second computer memory, scrubbing said second portion of second computer memory, and
initiating said first mode of operation in response to the identification of defective first and/or second computer memory by said second mode scrubbing,
wherein a request to write a third data to said defective portions of first and/or second computer memory causes the writing of said third data to said second portion of second computer memory, further wherein a request to fetch a fourth data from said defective portions of first and/or second computer memory causes the fetching of said fourth data from said second portion of second computer memory.

10. A method as in claim 9 wherein computer program code for incrementing and evaluating said counter, for alternating between said first and second modes of operation, and for storing said SPUE patterns is central processor unit millicode, said millicode being executed by a processor.

11. A method as in claim 9 wherein said detecting and correcting of error further comprises detecting and correcting errors located in said computer memory system during the initial loading operation of a machine, said computer memory being located in said machine.

12. A method as in claim 9 wherein said error detection and correction during the initial loading operation of a machine further comprises scrubbing said computer memory.

13. A method as in claim 9 further wherein first and/or second computer memory is determined to be defective where the value of a counter corresponding to a bit position corresponding to said first and/or second computer memory exceeds a threshold, said counter being incremented where scrubbing detects an error at said bit position.

* * * * *